United States Patent [19]
Tseng

[11] Patent Number: 5,710,074
[45] Date of Patent: Jan. 20, 1998

[54] INCREASED SURFACE AREA OF AN STC STRUCTURE VIA THE USE OF A STORAGE NODE ELECTRODE COMPRISED OF POLYSILICON MESAS AND POLYSILICON SIDEWALL SPACERS

[75] Inventor: Horng-Huei Tseng, Hsinchu, Taiwan

[73] Assignee: Vanguard International Semiconductor Corporation, Hsin-Chu, Taiwan

[21] Appl. No.: 734,062

[22] Filed: Oct. 18, 1996

[51] Int. Cl.$^6$ .................................... H01L 21/8242
[52] U.S. Cl. ................................ 438/253; 438/637
[58] Field of Search ............................. 438/253, 254, 438/255, 396, 397, 398, 637, 641, 674, 675

[56] References Cited

U.S. PATENT DOCUMENTS 5,061,650  10/1991  Dennison et al. .............. 438/253
5,447,882  9/1995  Kim ................................. 438/396
5,468,670  11/1995  Ryou ............................... 438/253
5,492,850  2/1996  Ryou ............................... 438/253

*Primary Examiner*—Chandra Chaudhari
*Attorney, Agent, or Firm*—George O. Saile; Stephen B. Ackerman

[57] ABSTRACT

A method of creating an STC structure, used for high density, DRAM designs, has been developed. The process consists of creating a lower, or storage node electrode, for the STC structure, consisting of multiple, polysilicon mesa structures, as well as polysilicon spacers, on the sides of the polysilicon mesas, with the polysilicon spacers protruding above the top surface of the polysilicon mesas. This is accomplished by initially creating a composite mesa structure, of an insulator layer, on a partially etched polysilicon layer. After creation of the polysilicon spacer, on the sides of the composite, mesa structure, the insulator is selectively removed, resulting in polysilicon mesas, with protruding polysilicon spacers. This storage node configuration results in an significant increase of surface area, when compared to storage nodes fabricated with flat topographies.

27 Claims, 4 Drawing Sheets

INCREASED SURFACE AREA OF AN STC STRUCTURE VIA THE USE OF A STORAGE NODE ELECTRODE COMPRISED OF POLYSILICON MESAS AND POLYSILICON SIDEWALL SPACERS

BACKGROUND OF THE INVENTION

(1) Field of the Invention

The present invention relates to methods used for fabrication of high density, semiconductor memory cells, and more specifically to a process used to create a stacked capacitor, DRAM structure, with increased capacitance resulting from an increased surface capacitor surface area.

(2) Description of the Prior Art

The objectives of the semiconductor industry are to continually improve device performance, while still attempting to decrease the manufacturing cost of specific semiconductor chips. These objectives have been in part realizedby the ability of the semiconductor industry to produce chaps with sub-micron features, or mtcro-miniaturization. Smaller features allow the reduction in performance degrading capacitances and resistances to be realized. In addition smaller features result in a smaller chip, however possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 64 million cells per chip, or greater, has resulted in a specific cell in which a smaller transfer gate transistor is being used, and thus limiting the amount of area the overlying STC structure can occupy, without interfering with neighboring cells.

Solutions to the shrinking design area, assigned to STC structures, have been addressed via novel semiconductor fabrication processes which result in an increase in surface area for only the lower, or storage electrode, of the STC structure, while maintaining the area original design area of the STC structure. One method for achieving this objective been accomplished by creating lower electrodes with pillars, or protruding shapes of polysilicon, thus resulting in a greater electrode surface area then would have been achieved with conventional flat surfaces. Kim, in U.S. Pat. No. 5,447,882, describes such an STC structure, comprised of a lower electrode, formed by creating protruding polysilicon features, via patterning of a polysilicon layer. This invention will describe a process in which a lower electrode of an STC structure is fabricated using multiple polysilicon mesas, each featuring protruding polysilicon spacers, thus offering greater increases in lower electrode surface area, of an STC structure, then for structures described in prior art.

SUMMARY OF THE INVENTION

It is an object of this invention to create a DRAM device, with an STC structure, in which the surface area of the lower electrode, of the STC structure is increased, without increasing the width of the STC structure.

It is another object of this invention to form the lower electrode of the STC structure by initially defining the capacitor area in a composite layer of insulator layer, overlying a polysilicon layer.

It is yet another object of this invention to create a lower electrode featuring a mesa pattern, defined by etching a pattern in the insulator layer, and continuing to etch the mesa pattern into only a portion of the underlying polysilicon layer, leaving an unetched portion of polysilicon, underlying the multiple mesas.

It is still another object of this invention to form polysilicon spacers on the sidewalls of the mesas, followed by removal of the meas insulator layer, resulting in a lower electrode of multiple mesas, comprised of protruding polysilicon features.

In accordance with the present invention a method for fabricating increased capacitance DRAM devices, via use of an STC structure, comprised of a lower electrode with increased surface area, has been developed. A transfer gate transistor comprised of: a thin gate insulator; a polysilicon gate structure; lightly doped source and drain regions; insulator spacers on the sidewalls of the polysilicon gate structure; and heavily doped source and drain regions; is formed on a semiconductor substrate. An insulator layer is deposited and an opening in the insulator layer is made to expose the source region of the transfer gate transistor. A contact plug, of conductive material, is formed in the opening to the source region, followedby the deposition of a polysilicon layer, and an overlying insulator layer. The insulator layer and underlying polysilicon layer are patterned to form the desired width of the lower electrode of the STC structure. A pattern of multiple mesas are then etched in the insulator layer, and partially into the polysilicon layer, resulting in multiple mesas of insulator—polysilicon, on a continuous, underlying polysilicon layer. Another deposition of polysilicon is performed, followed by an anisotropic, reactive ion etching procedure, producing polysilicon spacers on the sidewalls of the insulator-polysilicon mesas. The insulator, of the insulator-polysilicon mesas, is then removed, resulting in a polysilicon lower electrode, with multiple mesas featuring protruding polysilicon spacers, on the sidewalls of the mesas. A capacitor dielectric layer is next formed on the polysilicon lower electrode, followed by the creation of an upper polysilicon electrode, completing the processing of the STC structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a DRAM device, with increased capacitance, resulting from the use of a STC structure that features a lower electrode, comprised of polysilicon spacers, on the sides of polysilicon mesas, will now be described. The transfer gate transistor, used for this DRAM device, in this invention, will be an N channel device. However the STC structure, with the increased surface area described in this invention, can also be applied to P channel, transfer gate transistor.

Figure 1:
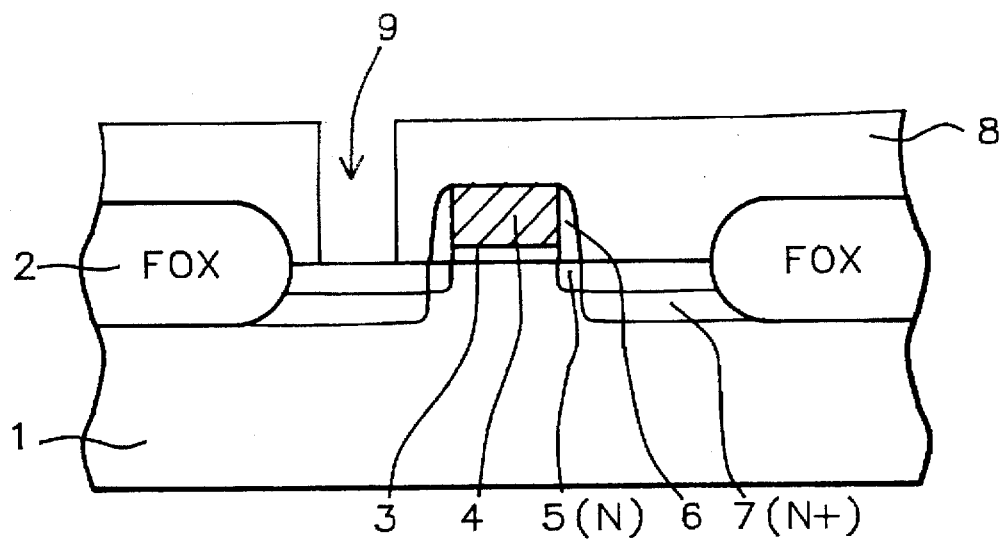
FIGS. 1–7, which schematically shows, in crosssectional style, the key fabrication stages used in the creation of a DRAM device, with a STC structure, with an increased surface area, resulting from a lower electrode comprised of polysilicon spacers on the sides of polysilicon mesas.

Referring to FIG. 1, a P type, semiconductor substrate, 1, with a <100>, single crystalline orientation, is used. Field oxide, (FOX), regions, 2, are used for purposes of isolation. Briefly the FOX regions, 2, are formed via thermal oxidation, in an oxygen-steam ambient, at a temperature between about 850° to 1050° C., to a thickness between about 3000 to 5000 Angstroms. A patterned oxidation resistant mask of silicon nitride-silicon oxide is used to prevent FOX regions, 2, from growing on areas of substrate, 1, to be used for subsequent device regions. After the growth of the FOX regions, 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer, 3, of silicon oxide is thermally grown in an oxygen-steam ambient, at a temperature between about 850° to 1050° C., to a thickness between about 50 to 200 Angstroms. A first polysilicon layer is next deposited using low pressure chemical vapor deposition, (LPCVD), procedures, at a temperature between about 500° to 700° C., to a thickness between about 1500 to 4000 Angstroms. The polysilicon can either be grown intrinsically and doped via ion implantation of arsenic or phosphorous, at an energy between about 30 to 80 KeV, at a dose between about 1E13 to 1E16 atoms/cm$^2$, or grown using in situ doping procedures, via the incorporation of either arsine or phosphine to the silane ambient. Conventional photolithographic and reactive ion etching, (RIE), procedures, using $Cl_2$ as an etchant, are used to pattern the polysilicon layer, creating polysilicon gate structure, 4, shown schematically in FIG. 1. Photoresist removal is accomplished via plasma oxygen ashing and careful wet cleans.

A lightly doped source and drain region, 5, is next formed via ion implantation of phosphorous, at an energy between about 20 to 50 KeV, at a dose between about 1E13 to 1E14 atoms/cm$^2$. A first insulator layer of silicon oxide is then deposited using either LPCVD or PECVD procedures, at a temperature between about 400° to 700° C., to a thickness between about 1500 to 4000 Angstroms, followed by an anisotropic RIE procedure, using $CHF_3$ as an etchant, creating insulator spacer, 6, on the sidewalls of polysilicon gate structure, 4. A heavily doped source and drain region, 7, is then formed via ion implantation of arsenic, at an energy between about 30 to 80 KeV, at a dose between about 1E15 to 1E16 atoms/cm$^2$. The result of these procedures are schematically shown in FIG. 1.

Figure 2:
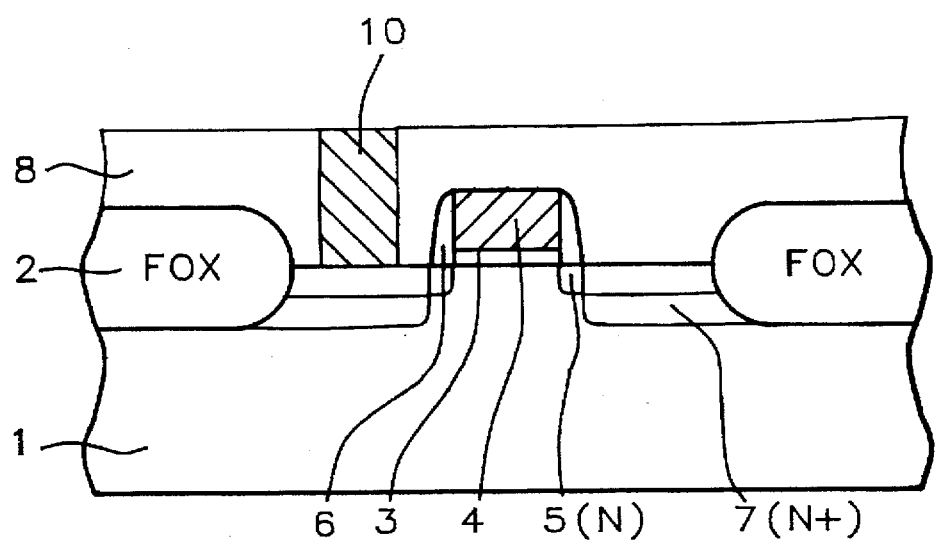

A second insulator layer of silicon oxide, 8, is next deposited using LPCVD or PECVD procedures, at a temperature between about 400° to 700° C., to a thickness between about 4000 to 6000 Angstroms. Conventional photolithographic and RIE procedures, using $CHF_3$ as an etchant, are used to open contact hole, 9, in silicon oxide layer, 9, exposing the top surface of heavily doped source and drain region, 7. Photoresist removal is performed via use of plasma oxygen ashing and careful wet cleans. A conductive contact plug, 10, schematically shown in FIG. 2, is next formed. Several options of forming contact plug, 10, are available. The preferred option is the selective LPCVD deposition of tungsten, performed at a temperature between about 300° to 500° C., to a thickness equal to the thickness of silicon oxide layer, 8, between about 4000 to 6000 Angstroms, using $WF_6$ and silane as reactants. This deposition results in a tungsten contact plug, 10, in contact hole, 9, formed by selectively depositing only on exposed silicon surfaces, therefore eliminating the need for etchback or planarization. A second option is to deposit tungsten via r.f. sputtering, or non-selective LPCVD procedures, to a thickness great enough to allow complete filling of contact hole 9, and followed by an planarization procedure, either RIE or chemical mechanical polishing, used to remove unwanted tungsten from areas outside the contact hole to form tungsten contact plug, 10. A third option is to deposit polysilicon via LPCVD procedures, to a thickness again great enough to completely fill contact hole, 9, and followed again by planarization procedures, either RIE or chemical mechanical polishing, to result in a polysilicon contact plug, 10, only in contact hole, 9.

Figure 3:
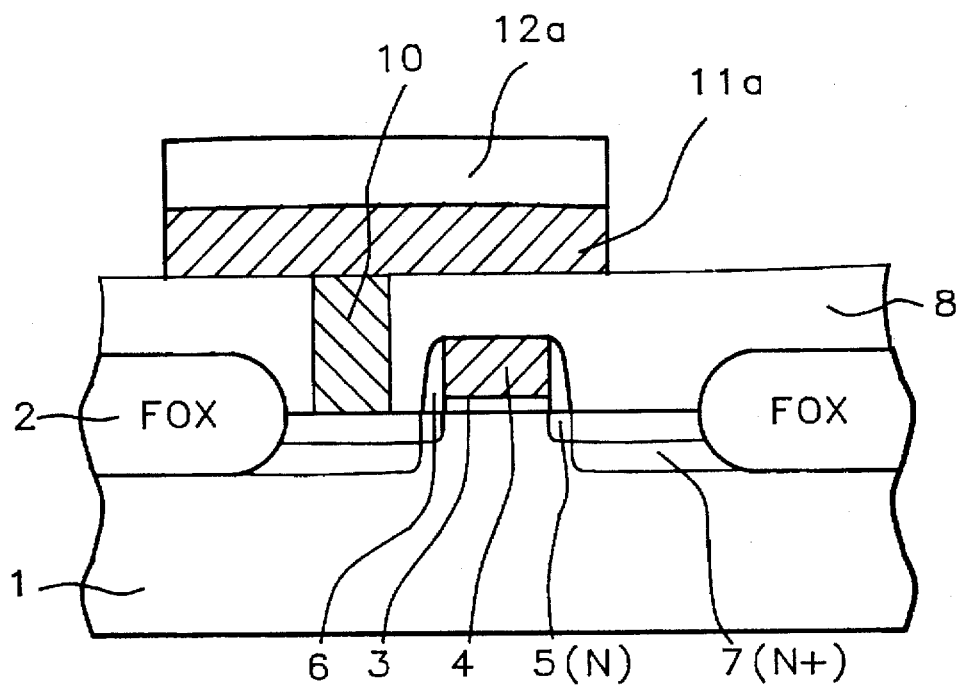

A second layer of polysilicon, 11a, is next deposited, via LPCVD procedures, at a temperature between about 500° to 700° C., to a thickness between about 3000 to 6000 Angstroms. Polysilicon layer, 11a, can be deposited intrinsically and doped via ion implantation of either phosphorous or arsenic, at an energy between about 25 to 75 KeV, at a dose between about 1E13 to 1E15 atoms/cm$^2$, or polysilicon layer, 11a, can be deposited using in situ doping procedures, via the addition of either phosphine or arsine, to a silane ambient. A third insulator layer of silicon oxide, 12a, is next deposited using either LPCVD or plasma enhanced chemical vapor deposition, (PECVD), procedures, at a temperature between about 650° to 750° C., to a thickness between about 3000 to 6000 Angstroms. Insulator layer, 12a, can also be silicon nitride, again obtained via either LPCVD or PECVD procedures. Insulator layer, 12a, can also be a BPSG or PSG layer, obtained via addition of either $PH_3$ and $B_2H_6$, or just $PH_3$, to a TEOS, (tetraethylorthosilicate), ambient. FIG. 3, shows the result of a first photolithographic and RIE procedure, using $CHF_2$ as an etchant for silicon oxide layer, 12a, and $Cl_2$ as an etchant for polysilicon layer, 11a. This procedure defines the width of the lower electrode, of a subsequent STC structure. Photoresist removal is accomplished via plasma oxygen ashing and careful wet cleans.

Figure 4:
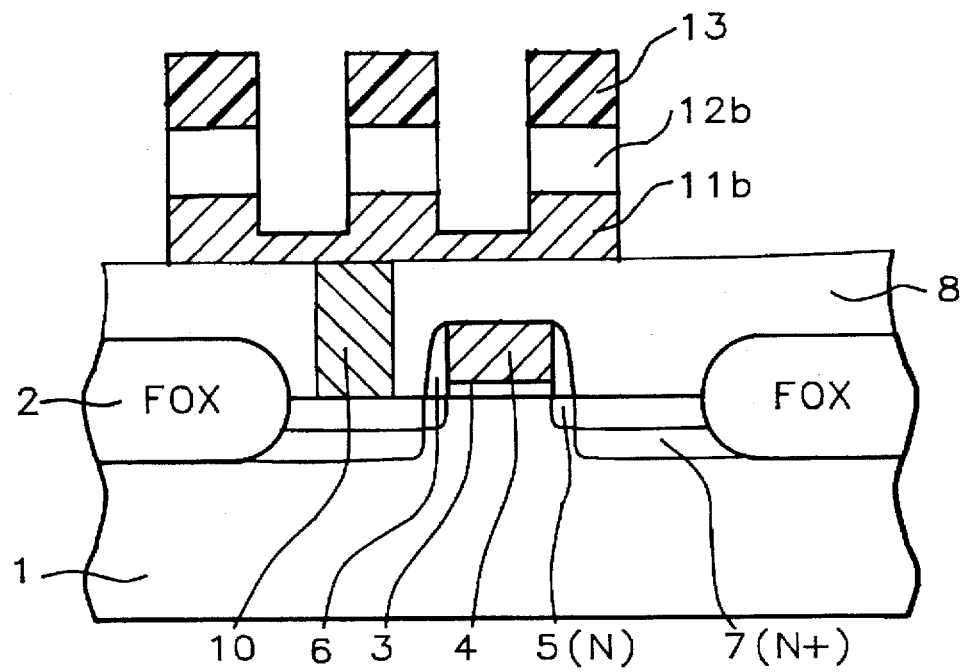
Figure 5:
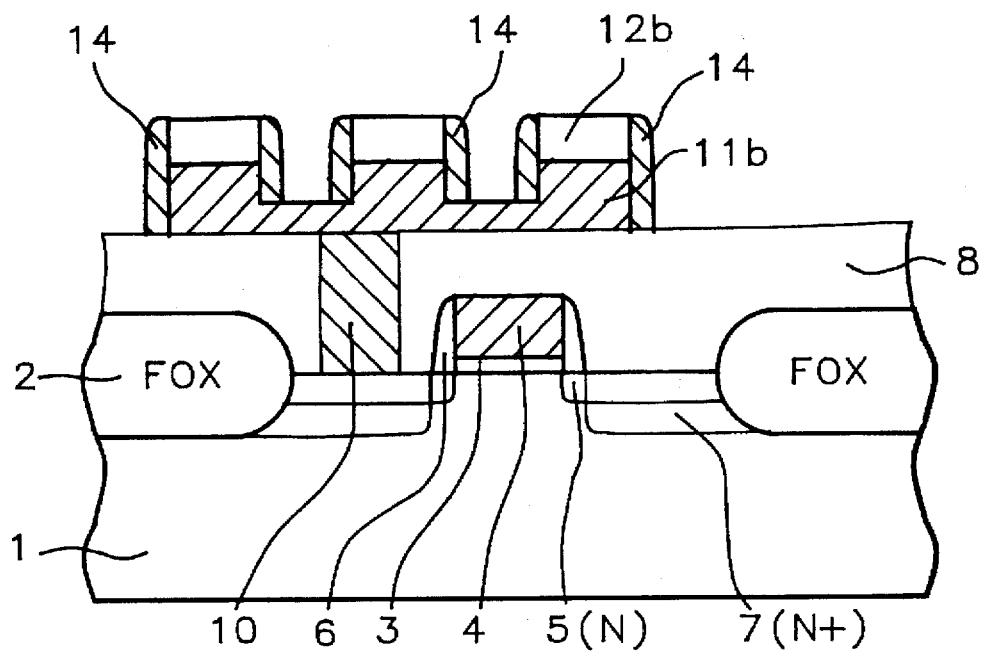

A second photolithographic and RIE procedure is next used to create a pattern of multiple, silicon oxide, 12b,—polysilicon, 11b, mesas, schematically illustrated in FIG. 4. First, photoresist shapes, 13, are used as a mask to transfer photoresist shape, 13, to the underlying silicon oxide layer, 12a, of the lower electrode, via RIE procedures using $CHF_3$ as an etchant. Next polysilicon layer, 11a, of the lower electrode shape is patterned, via RIE etching, using $Cl_2$ as an etchant, and again using photoresist shape, 13, as a mask. However in this procedure polysilicon layer, 11a, is only etched to remove between about 1500 to 3000 Angstroms, therefore leaving between about 1500 to 3000 Angstroms of polysilicon layer, 11a, unetched, and maintaining the continuity of polysilicon layer, across the width of the lower electrode, and underlying the multiple, silicon oxide, 12b, polysilicon, 11b, mesas. Photoresist shapes, 13, are then removed via plasma ashing and careful wet cleans.

A third layer of polysilicon is next deposited, using LPCVD procedures, at a temperature between about 500° to 700° C., to a thickness between about 500 to 2000 Angstroms. This polysilicon layer is grown using in situ doping procedures, by the addition of phosphine to the silane ambient. An anisotropic RIE procedure, using $Cl_2$ as an etchant is next employed to create polysilicon spacers, 14, on the sidewalls of the multiple, silicon oxide, 12b polysilicon, 11b, mesas. This is shown schematically in FIG.

Figure 6:
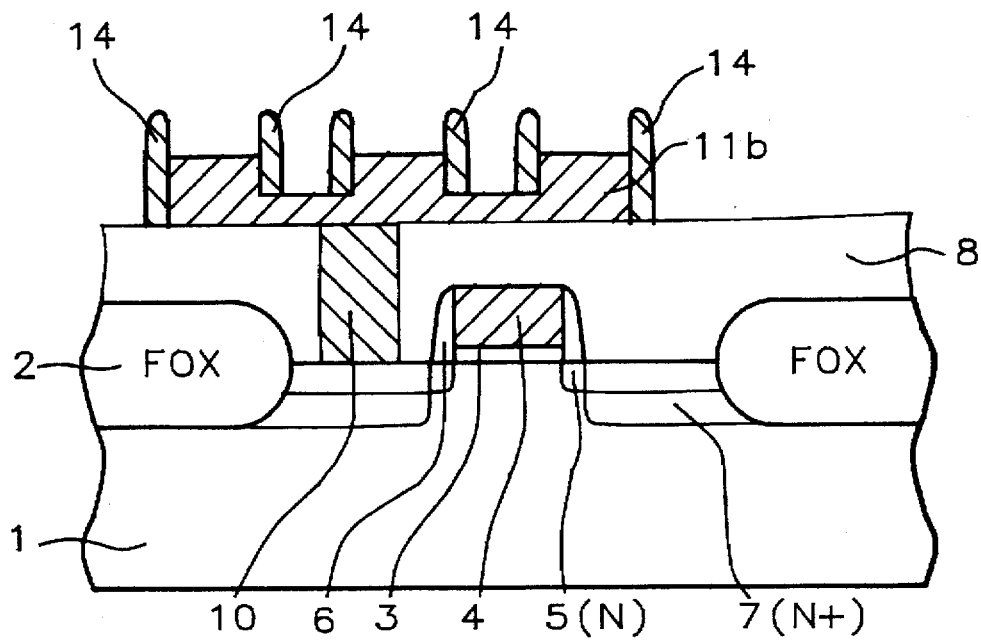

5. The height of polysilicon spacers, 14, is the sum of the thickness of silicon oxide mesa, 12b, and the amount of polysilicon layer, 11a, removed during the formation of the multiple, silicon oxide, 12b,—polysilicon, 11b, mesas. FIG. 6. schematically shows the lower electrode structure after selective removal of silicon oxide layer, 12b, using a dilute, or buffered, hydrofluoric acid solution. The lower electrode, or storage node electrode, is comprised of polysilicon mesas, 11b, and protruding polysilicon spacers, 14.

The polysilicon mesa, polysilicon spacer, lower electrode structure, can be used for high density, DRAM designs, such as 64 Mb densities or greater. For high density designs, less available space is given for the STC structure, and therefore less mesas can be used. However the desired capacitances, or surface area, can be still be maintained by increasing the height of the polysilicon spacer. This can be accomplished via the use of mesas with either a thicker silicon oxide layer, a thicker polysilicon layer, or a deeper etching of the polysilicon, used for mesa creation.

Figure 7:
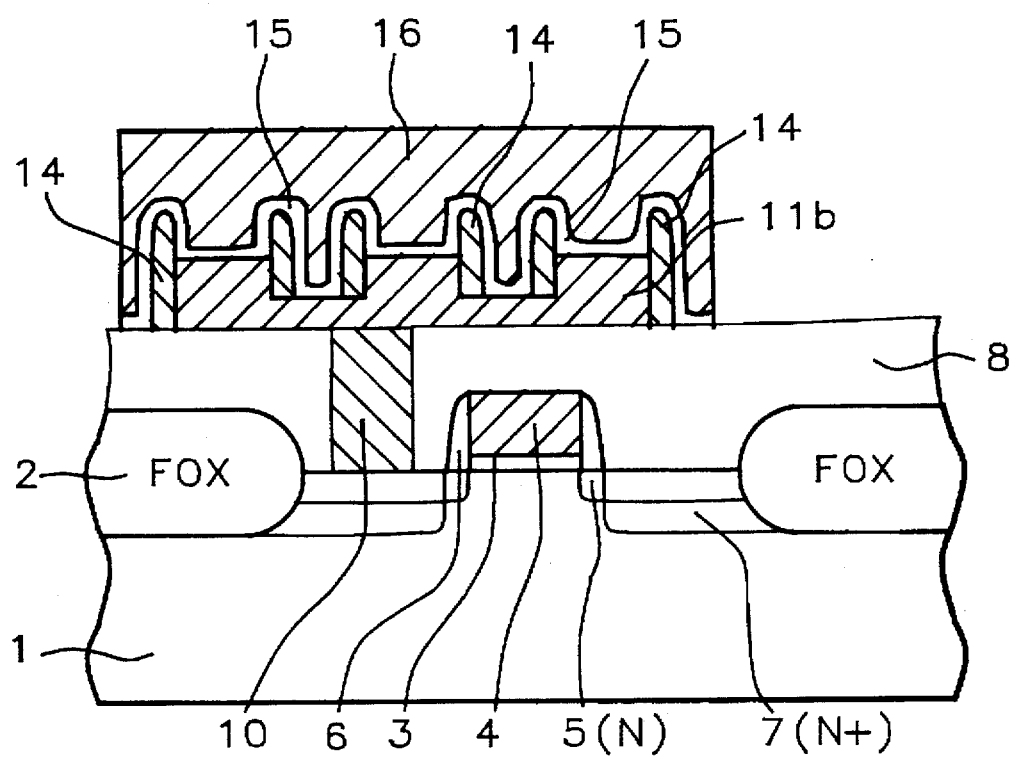

FIG. 7, schematically shows the completion of the STC structure. First a dielectric layer, 15, is formed, overlying the polysilicon mesa, lower electrode, 11b, with protruding polysilicon spacers, 14. Dielectric layer, 15, can be an insulator layer possessing a high dielectric constant, such as $Ta_2O_5$, obtained via r.f sputtering techniques, at a thickness between about 10 to 100 Angstroms. Dielectric layer, 15, can also be ONO, (Oxidized—silicon Nitride—silicon Oxide). The ONO layer is formed by initially growing a silicon dioxide layer, between about 10 to 50 Angstroms, followed by the deposition of a silicon nitride layer, between about 10 to 20 Angstroms. Subsequent thermal oxidation of the silicon nitride layer results in the formation of a silicon oxynitride layer on silicon oxide, at a silicon oxide equivalent thickness of between about 40 to 80 Angstroms. Finally another layer of polysilicon is deposited, via LPCVD procedures, at a temperature between about 500° to 700° C., to a thickness between about 1000 to 3000 Angstroms. Doping of this polysilicon layer is accomplished via the in situ deposition procedure, again via the addition of phosphine, to a silane ambient. Photolithographic and RIE procedures, using $Cl_2$ as an etchant, are next employed to create polysilicon upper electrode, or plate electrode, 16, shown schematically in FIG. 7. Photoresist is again removed via plasma oxygen ashing and careful wet cleans.

While this invention has been particularly shown and described with reference to the preferred embodiments thereof, it will be understoodby those skilled in the art that various changes in form and details may be made without departing from the spirit and scope of this invention.

What is claimed is:

1. A method of fabricating a DRAM device, on a semiconductor substrate, comprised of an underlying transistor; with a gate insulator, a gate electrode structure, formed from a first polysilicon layer, insulator sidewall spacers, formed from a first insulator layer, and a source and drain region, and an overlying STC structure; with a lower electrode, a dielectric layer, and an overlying upper electrode, and with said lower electrode, of said STC structure, containing multiple polysilicon mesas, and polysilicon spacers, on the sides of the polysiticon mesas, and electrically contacting said source and drain region, of said transistor, comprising the steps of:

depositing a second insulator layer on said underlying transistor of said DRAM device;

opening a contact hole, in said second insulator layer, to expose top surface of said source and drain region, of said underlying transistor;

forming a conductive contact plug, in said contact hole, contacting top surface of said source and drain region;

depositing a second polysilicon layer on top surface of said second insulator layer, and on top surface of said conductive contact plug, exposed in said contact hole;

depositing a third insulator layer on said second polysilicon layer;

a first patterning of said third insulator layer, and of said second potysilicon layer, to form initial phase of said lower electrode structure, of said STC structure;

a second patterning of said lower electrode structure, to form a second phase of said lower electrode structure, via RIE of said third insulator layer, and via RIE of only a topportion of said second polysilicon layer, creating composite, first mesa structures, of said third insulator layer, and of said top portion of said second polysilicon layer, overlying said second polysilicon layer;

depositing a third polysilicon layer on said composite first mesa structures, and on said top surface of said second polysilicon layer, between said composite, first mesa structures;

anisotropic etching of said third polysilicon layer, to form said polysilicon spacers on the sides of said composite, first mesa structures;

removal of said third insulator layer, from said composite first mesa structures, converting said composite, first mesa structures to second mesa structures, comprised of only said top portion of said second polysilicon, with said polysilicon spacers, on the sides of said second mesa structures, protruding above the top surface of said second mesa structures;

forming said dielectric layer on said second phase of lower electrode, comprised of said second mesa structures, and said polysilicon spacers, on sides of said second mesa structures;

depositing a fourth polysilicon layer on said dielectric layer; and patterning of said fourth polysilicon layer to form said upper electrode, of said STC structure.

2. The method of claim 1, wherein said conductive contact plug, in said contact hole, is tungsten, formed via selective, LPCVD deposition of tungsten, at a temperature between about 300° to 500° C., to a thickness between about 4000 to 6000 Angstroms, using $WF_6$ and $SiH_4$ as reactants.

3. The method of claim 1, wherein said conductive contact plug is tungsten, depositing using LPCVD procedures at a temperature between about 400° to 600° C., to a thickness between about 4000 to 6000 Angstroms, with the unwanted tungsten removed from areas outside said contact hole, via either RIE or chemical mechanical procedures.

4. The method of claim 1, wherein said conductive contact plug is polysilicon, deposited via LPCVD procedures, either grown via in situ doping procedures, or doped via ion implantation procedures, with the unwanted polysilicon removed from areas outside said contact hole, via either RIE or chemical mechanical procedures.

5. The method of claim 1, wherein said second polysilicon layer is deposited using LPCVD procedures, at a temperature between about 500° to 700° C., to a thickness between about 3000 to 6000 Angstroms.

6. The method of claim 1, wherein said third insulator layer is silicon oxide, deposited using either LPCVD or PECVD procedures, at a temperature between about 650° to 750° C., to a thickness between about 3000 to 6000 Angstroms.

7. The method of claim 1, wherein said third insulator layer is silicon nitride, deposited using either LPCVD or PECVD procedures, at a temperature between about 650° to 750° C., and to a thickness between about 3000 to 6000 Angstroms.

8. The method of claim 1, wherein said initial phase of lower electrode is formed via RIE processing of said third insulator layer, using $CHF_3$ as an etchant, and of said second polysilicon layer, using $Cl_2$ as an etchant.

9. The method of claim 1, wherein said second phase of lower electrode structure is comprised of said composite, first mesa structures of said third insulator layer, between about 3000 to 6000 Angstroms, in height, and of only a top portion of said second polysilicon layer, between about 1500 to 3000 Angstroms, in height, formed via RIE procedures using $CHF_3$ as an etchant for said third insulator layer, and $Cl_2$ as an etchant for said top portion of said second polysiticon layer.

10. The method of claim 1, wherein said third polysilicon layer is deposited via LPCVD procedures, at a temperature between about 500° to 700° C., to a thickness between about 500 to 2000 Angstroms.

11. The method of claim 1, wherein said polysilicon spacers are formed, on the sides of said composite, first mesa structures, via anisotropic RIE of said third polysilicon layer, using $Cl_2$ as an etchant, with the height of said polysilicon spacers between about 4500 to 9000 Angstroms.

12. The method of claim 1, wherein said third insulator layer, of said composite first mesa structures, is removed via use of a dilute, or a buffered hydrofluoric acid solution.

13. The method of claim 1, wherein said dielectric layer is ONO, at an equivalent silicon dioxide thickness between about 40 to 80 Angstroms, created by an initial thermal oxidation to form a silicon oxide layer, between about 10 to 50 Angstroms, followed by a deposition of silicon nitride, to a thickness between about 10 to 20 Angstroms, and thermal oxidation of said silicon nitride layer, creating a silicon oxynitride layer, on the underlying, said silicon oxide layer.

14. The method of claim 1, wherein said dielectric layer is $Ta_2O_5$, obtained via r.f. sputtering techniques, at a thickness between about 10 to 100 Angstroms.

15. The method of claim 1, wherein said fourth polysilicon layer, used for creation of said upper electrode of said STC structure, is deposited using LPCVD procedures, at a temperature between about 500° to 700° C., to a thickness between about 1000 to 3000 Angstroms.

16. A method of fabricating a stacked capacitor structure, (STC), overlying a transistor structure, for a DRAM device, in which the surface area of the storage node electrode, of said STC structure, is increased via formation of polysilicon mesas and polysilicon spacers, on the sides of said polysilicon mesas, and protruding above the top surface of said polysilicon meas, comprising the steps of:

depositing a first polysilicon layer on a first insulator layer, and on a top surface of a conductive contact plug, with said conductive contact plug embedded in said first insulator layer, and with said conductive contact plug contacting an underlying transistor region, of said DRAM device;

depositing a second insulator layer on said first polysilicon layer;

a first patterning of said second insulator layer, and of said first polysilicon layer, to create initial phase of said first storage node electrode;

a second patterning of said storage node electrode, to create a second phase of said storage node electrode, via RIE of said second insulator layer, and via RIE of only a top portion of said first polysilicon layer, to create composite, first mesa structures, of said second insulator layer, and of said top portion of said first polysilicon layer, overlying said first polysilicon layer;

depositing a second polysilicon layer on said composite, first mesa structures, and on said top surface of said second polysilicon layer, exposed between said composite, first mesa structures;

anisotropic etching of said second polysilicon layer, to form said polysilicon spacers on the sides of said composite, first mesa structures;

removal of said second insulator layer from said composite, first mesa structures, converting said composite, first mesa structures to second mesa structures, comprised of only said top portion of said first polysilicon layer, with said polysilicon spacers on the sides of said second mesa structures, protruding above the top surface of said second mesa structures;

forming a dielectric layer on said second phase of said storage node electrode, with said second phase of said storage node electrode comprised of said second mesa structures, and said polysilicon spacers, on the sides of said second mesa structures;

depositing a third polysilicon layer on said dielectric layer; and patterning of said third polysilicon layer to form plate electrode, of said STC structure.

17. The method of claim 16, wherein said first polysilicon layer is obtained via LPCVD procedures, at a temperature between about 500° to 700° C., to a thickness between about 3000 to 6000 Angstroms.

18. The method of claim 16, wherein said second insulator layer is silicon oxide, deposited using LPCVD or PECVD procedures, at a temperature between about 650° to 750° C., to a thickness between about 3000 to 6000 Angstroms.

19. The method of claim 16, wherein said second insulator layer is silicon nitride, deposited using LPCVD or PECVD procedures, at a temperature between about 650° to 750° C., to a thickness between about 3000 to 6000 Angstroms.

20. The method of claim 16, wherein said initial phase of said storage node electrode, is formed via RIE processing of said second insulator layer, using $CHF_3$ as an etchant, and of said first polysilicon layer, using $Cl_2$ as an etchant.

21. The method of claim 16, wherein said second phase of said storage node electrode is comprised of said composite, first mesa structures, of said second insulator layer, between about 3000 to 6000 Angstroms in height, and of only a top portion of said first polysilicon layer, between about 1500 to 3000 Angstroms, in height, formed via RIE procedures, using $CHF_3$ as an etchant for said second insulator layer, and using $Cl_2$ as an etchant for said top portion of said first polysilicon layer.

22. The method of claim 16, wherein said second polysilicon layer is deposited using LPCVD procedures, at a temperature between about 500° to 700° C., to a thickness between about 500 to 2000 Angstroms.

23. The method of claim 16, wherein said polysilicon spacers are formed, on the sides of said composite, first mesa structures, via RIE of said second polysilicon layer, using $Cl_2$ as an etchant, with the height of said polysilicon spacers between about 4500 to 9000 Angstroms.

24. The method of claim 16, wherein said second insulator layer, of said composite, first mesa structures, is removed via use of a dilute, or buffered hydrofluoric acid solution.

25. The method of claim 16, wherein said dielectric layer is ONO, with an equivalent silicon oxide thickness between about 40 to 80 Angstroms, created by growing a thin silicon oxide layer on said storage node electrode, at a thickness between about 10 to 50 Angstroms, depositing between about 10 to 20 Angstroms of a silicon nitride layer, and oxidizing said silicon nitride layer to from a silicon oxynitride layer on said thin silicon oxide layer.

26. The method of claim 16, wherein said thin dielectric layer is $Ta_2O_5$, deposited using r.f. sputtering procedures, to a thickness between about 10 to 100 Angstroms.

27. The method of claim 16, wherein said third polysilicon layer is deposited using LPCVD procedures, at a temperature between about 500° to 700° C., to a thickness between about 1000 to 3000 Angstroms.

* * * * *